United States Patent
Shah et al.

(10) Patent No.: US 11,755,211 B2
(45) Date of Patent: *Sep. 12, 2023

(54) OVERHEAD REDUCTION IN DATA TRANSFER PROTOCOL FOR NAND MEMORY

(71) Applicant: Western Digital Technologies, Inc., San Jose, CA (US)

(72) Inventors: Grishma Shah, San Jose, CA (US); Daniel Tuers, Kapaa, HI (US); Sahil Sharma, San Jose, CA (US); Hua-Ling Cynthia Hsu, Fremont, CA (US); Yenlung Li, San Jose, CA (US); Min Peng, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/958,934

(22) Filed: Oct. 3, 2022

(65) Prior Publication Data

US 2023/0022998 A1     Jan. 26, 2023

Related U.S. Application Data

(63) Continuation of application No. 17/175,099, filed on Feb. 12, 2021, now Pat. No. 11,487,446.

(Continued)

(51) Int. Cl.
    *G06F 3/06*          (2006.01)
    *G06F 12/0882*     (2016.01)
    *G06F 12/02*        (2006.01)

(52) U.S. Cl.
    CPC .......... *G06F 3/0629* (2013.01); *G06F 3/0614* (2013.01); *G06F 3/0653* (2013.01);

(Continued)

(58) Field of Classification Search
    CPC .... G06F 3/0614; G06F 3/0653; G06F 3/0659; G06F 3/0679
    See application file for complete search history.

(56) References Cited

U.S. PATENT DOCUMENTS 8,285,917 B2    10/2012   Jullien et al.
9,442,662 B2     9/2016   Dancho et al.
(Continued)

FOREIGN PATENT DOCUMENTS

KR    20170020851 A    2/2017
KR    20170094135 A    8/2017

OTHER PUBLICATIONS

Luo, Q. et al. "Dynamic virtual page-based flash translation layer with novel hot data identification and adaptive parallelism management." IEEE Access 6 (2018): 56200-56213.

*Primary Examiner* — Tracy A Warren
(74) *Attorney, Agent, or Firm* — MICHAEL BEST & FRIEDRICH LLP

(57) ABSTRACT

A data storage device including, in one implementation, a NAND memory and a controller. The NAND memory includes a read/write circuit configured to determine and store initial physical column addresses for each plane included in the NAND memory. The controller is configured to send a read-transfer command and a one-byte address to the NAND memory. The read/write circuit is also configured to retrieve a first initial physical column address from the initial physical column addresses stored in the NAND memory after the NAND memory receives the one-byte address from the controller. The first initial physical column address is associated with a die address and a plane address included in the one-byte address. The read/write circuit is further configured to retrieve a first set of data stored at the (Continued)

first initial physical column address. The read/write circuit is also configured to output the first set of data to the controller.

20 Claims, 7 Drawing Sheets

Related U.S. Application Data

(60) Provisional application No. 63/120,787, filed on Dec. 3, 2020.

(52) U.S. Cl.
CPC .......... *G06F 3/0659* (2013.01); *G06F 3/0679* (2013.01); *G06F 12/0207* (2013.01); *G06F 12/0882* (2013.01)

(56) References Cited

U.S. PATENT DOCUMENTS

| | | |
|---|---|---|
| 9,524,799 B2 | 12/2016 | Desireddi et al. |
| 9,626,312 B2 | 4/2017 | Frid et al. |
| 9,627,082 B2 | 4/2017 | Jigour et al. |
| 9,734,911 B2 | 8/2017 | Sinclair et al. |
| 10,268,387 B2 | 4/2019 | Cr et al. |
| 10,325,664 B2 | 6/2019 | Tokutomi et al. |
| 2006/0056249 A1 | 3/2006 | Nagao |
| 2009/0290433 A1 | 11/2009 | Park |
| 2018/0277180 A1 | 9/2018 | Yoshida |
| 2018/0301188 A1 | 10/2018 | Choi et al. |
| 2019/0102110 A1 | 4/2019 | Shaharabany et al. |
| 2019/0237117 A1 | 8/2019 | Polney |
| 2020/0004443 A1 | 1/2020 | Secatch et al. |
| 2020/0159418 A1 | 5/2020 | Liu et al. |
| 2021/0191850 A1 | 6/2021 | Subbarao et al. |
| 2021/0365369 A1 | 11/2021 | Shin et al. |
| 2022/0261181 A1 | 8/2022 | Venugopal et al. |

OVERHEAD REDUCTION IN DATA TRANSFER PROTOCOL FOR NAND MEMORY

CROSS-REFERENCE TO RELATED APPLICATION

This application is a continuation of U.S. Non-Provisional patent application Ser. No. 17/175,099, filed Feb. 12, 2021, which claims priority to and the benefit of U.S. Provisional Patent Application No. 63/120,787, filed on Dec. 3, 2020, the entire contents of which is incorporated herein by reference.

BACKGROUND

This application relates generally to memory devices, and more particularly, to a controller and NAND memory that reduce execution time of data transfer operations, for example, by pre-calculating initial column addresses.

Data transfer protocols between controllers and NAND memory involve a significant number of command and address cycles as well as a wait time between command/address cycles and data transfer. Command and address cycles are required to be issued using legacy input/output ("I/O") speed and protocol. Data bytes, however, can be issued using toggle mode speeds. With every new generation of NAND memory, toggle mode speed scales by approximately 50%. Command/address speed, however, does not scale with toggle mode speed. As a result, command/address cycles add a significant overhead for memory devices that use higher toggle mode speeds.

SUMMARY

The wait time between command/address cycles and data transfer is primarily used for translating a received initial logical column address to an initial physical column address. The wait time between command/address cycles and data transfer can be reduced by pre-calculating initial physical column addresses. In addition, the total command/address cycle time can be reduced by removing redundant command and address cycles from data transfer protocols. Accordingly, the present disclosure provides data storage devices, methods, and apparatuses that, among other things, pre-calculate initial physical column addresses and implement data transfer protocols with less command/address cycles.

For example, the disclosure provides a data storage device. In one implementation, the data storage device includes a NAND memory and a controller. The NAND memory includes a plurality of dies and a read/write circuit. The plurality of dies each include a plurality of planes. The read/write circuit is configured to determine initial physical column addresses for each of the plurality of planes in each of the plurality of dies. The read/write circuit is also configured to store the initial physical column addresses in the NAND memory. The controller is coupled to the NAND memory. The controller is configured to send a read-transfer command to the NAND memory after the NAND memory stores the initial physical column addresses. The read-transfer command indicates that a one-byte address will follow. The controller is also configured to send the one-byte address to the NAND memory. The one-byte address includes a die address and a plane address. The read/write circuit is further configured to retrieve a first initial physical column address from the initial physical column addresses stored in the NAND memory after the NAND memory receives the one-byte address from the controller. The first initial physical column address is associated with the die address and the plane address. The read/write circuit is also configured to retrieve a first set of data stored at the first initial physical column address. The read/write circuit is further configured to output the first set of data to the controller.

The present disclosure also provides a method including determining, with a NAND memory, initial physical column addresses for each of a plurality of planes in each of a plurality of dies in the NAND memory. The method also includes storing the initial physical column addresses in the NAND memory. The method further includes sending a read-transfer command from a controller to the NAND memory after the NAND memory stores the initial physical column addresses. The read-transfer command indicates that a one-byte address will follow. The method also includes sending the one-byte address from the controller to the NAND memory. The one-byte address includes a die address and a plane address. The method further includes retrieving a first initial physical column address from the initial physical column addresses stored in the NAND memory after the NAND memory receives the one-byte address from the controller. The first initial physical column address is associated with the die address and the plane address. The method also includes retrieving a first set of data stored at the first initial physical column address in the NAND memory. The method further includes outputting the first set of data from the NAND memory to the controller.

The present disclosure further provides an apparatus including means for determining initial physical column addresses for each of a plurality of planes in each of a plurality of dies in a NAND memory. The apparatus also includes means for storing the initial physical column addresses in the NAND memory. The apparatus further includes means for sending a read-transfer command to the NAND memory after the NAND memory stores the initial physical column addresses. The read-transfer command indicates that a one-byte address will follow. The apparatus also includes means for sending the one-byte address to the NAND memory. The one-byte address includes a die address and a plane address. The apparatus further includes means for retrieving a first initial physical column address from the initial physical column addresses stored in the NAND memory after the NAND memory receives the one-byte address. The first initial physical column address is associated with the die address and the plane address. The apparatus also includes means for retrieving a first set of data stored at the first initial physical column address in the NAND memory. The apparatus further includes means for outputting the first set of data from the NAND memory.

Various aspects of the present disclosure provide for improvements in memory devices. The present disclosure can be embodied in various forms, including hardware or circuits controlled by software and/or firmware. The foregoing summary is intended solely to give a general idea of various aspects of the present disclosure and does not limit the scope of the present disclosure in any way.

DETAILED DESCRIPTION

In the following description, numerous details are set forth, such as data storage device configurations, controller operations, and the like, in order to provide an understanding of one or more aspects of the present disclosure. It will be readily apparent to one skilled in the art that these specific details are merely exemplary and not intended to limit the scope of this application. In particular, the functions associated with the controller and NAND may be performed by hardware (for example, analog or digital circuits), a combination of hardware and software (for example, program code or firmware stored in a non-transitory computer-readable medium that is executed by a processor or control circuitry), or any other suitable means. The following description is intended solely to give a general idea of various aspects of the present disclosure and does not limit the scope of the disclosure in any way. Furthermore, it will be apparent to those of skill in the art that, although the present disclosure refers to NAND memory, the concepts discussed herein are applicable to other types of solid-state memory, such as NOR, PCM (Phase Change Memory), ReRAM, etc.

Figure 1:
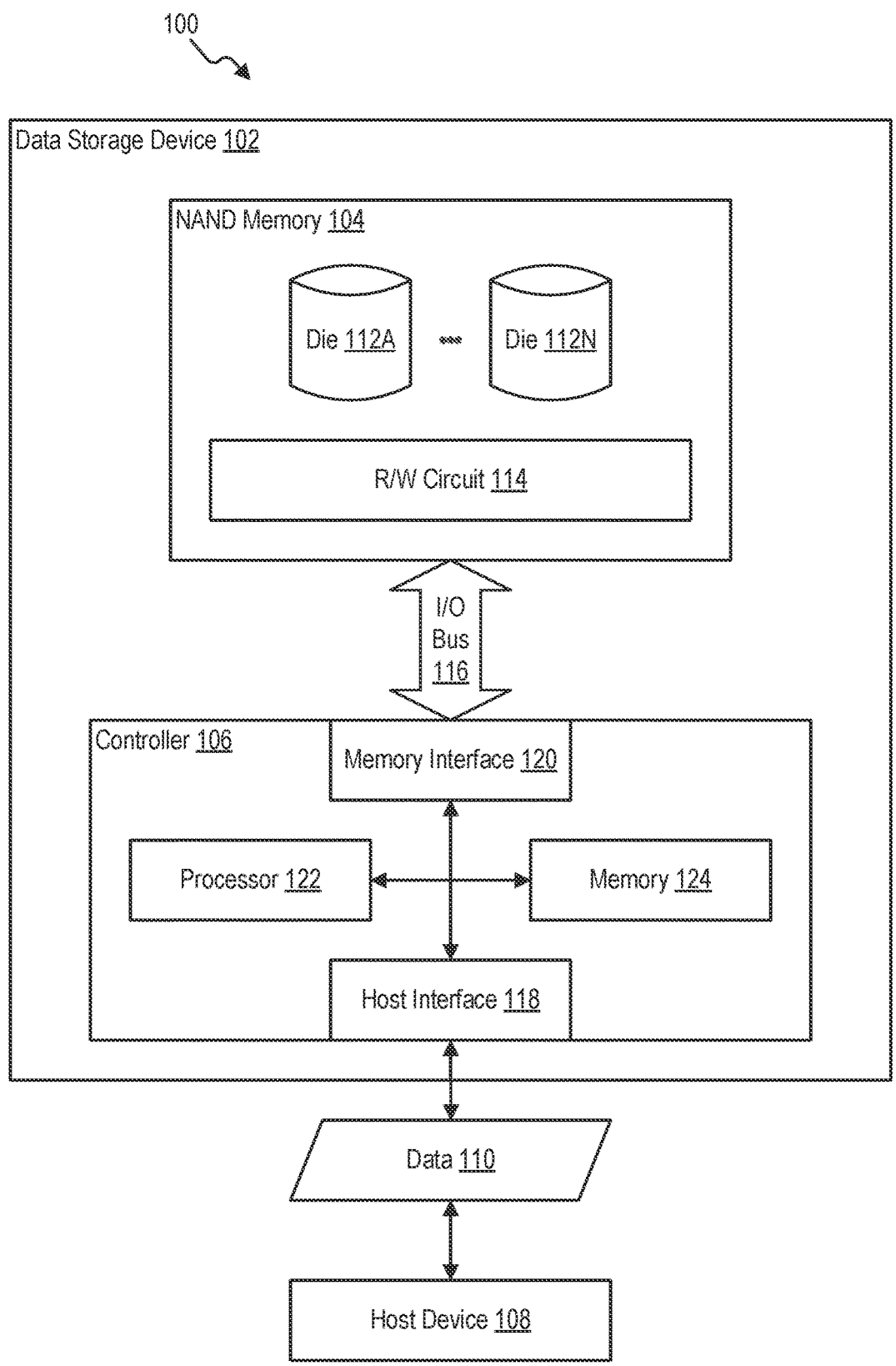
FIG. 1 is block diagram of one example of a system including a data storage device, in accordance with some implementations of the present disclosure.

FIG. 1 is block diagram of one example of a system 100 that includes a data storage device 102. In some implementations, the data storage device 102 is a flash memory device. For example, the data storage device 102 is a Secure Digital SD® card, a microSD® card, or another similar type of data storage device. The data storage device 102 illustrated in FIG. 1 includes a NAND memory 104 and a controller 106. The data storage device 102 is coupled to a host device 108. The host device 108 is configured to provide data 110 (for example, user data) to the data storage device 102 to be stored, for example, in the NAND memory 104. The host device 108 is also configured to request data 110 to be read from the NAND memory 104. The host device 108 is, for example, a smart phone, a music player, a video player, a gaming console, an e-book reader, a personal digital assistance, a tablet, a notebook computer, or another similar device.

The NAND memory 104 illustrated in FIG. 1 includes a plurality of dies 112A-112N (for example, NAND dies) and a read/write circuit 114. The read/write circuit 114 is configured to support operation of the plurality of dies 112A-112N of the NAND memory 104. Although depicted as a single component in FIG. 1, the read/write circuit 114 may be divided into separate components of the NAND memory 104, such as a read circuit and a write circuit. The read/write circuit 114 may be external to the plurality of dies 112A-112N of the NAND memory 104. Alternatively, one or more of the plurality of dies 112A-112N of the NAND memory 104 may include corresponding read/write circuitry that is operable to read data from and/or write data to storage elements within the individual die independent of any other read and/or write operations at any of the other dies. For example, each of the plurality of dies 112A-112N may include its own internal read/write circuitry. The NAND memory 104 is communicable coupled to the controller 106 via an input/output ("I/O") bus 116.

The controller 106 illustrated in FIG. 1 includes a host interface 118, a memory interface 120, a processor 122 (for example, a microprocessor, a microcontroller, a field-programmable gate array ["FPGA"] semiconductor, an application specific integrated circuit ["ASIC"], or another suitable programmable device), and a memory 124 (for example, a random access memory ["RAM"], a read-only memory ["ROM"], a non-transitory computer readable medium, or a combination thereof). The controller 106 is illustrated in FIG. 1 in a simplified form. One skilled in the art would recognize that a controller for a NAND memory may include additional modules or components other than those specifically illustrated in FIG. 1. Additionally, although the data storage device 102 is illustrated in FIG. 1 as including the controller 106, in other implementations, the controller 106 is instead located within the host device 108 or is otherwise separate from the data storage device 102. As a result, operations that would normally be performed by the controller 106 (for example, wear leveling, bad block management, data scrambling, garbage collection, address mapping, etc.) can be performed by the host device 108 or another device that connects to the data storage device 102.

The controller 106 is configured to send data to, and receive data and instructions from, the host device 108 via the host interface 118. The host interface 118 enables the host device 108 to, for example, read from the NAND memory 104 and to write to the NAND memory 104 using any suitable communication protocol. Suitable communication protocols include, for example, the Universal Flash Storage ("UFS") Host Controller Interface specification, the Secure Digital ("SD") Host Controller specification, etc.

The controller 106 is also configured to send data and commands to, and receive data from, the NAND memory 104 via the memory interface 120. As an illustrative example, the controller 106 is configured to send data and a program command to instruct the NAND memory 104 to store data in a particular memory location in the NAND memory 104. The controller 106 is also configured to send a read-transfer command to the NAND memory 104 to read data from a particular memory location in the NAND memory 104.

The processor 122 is operatively connected to the various modules within the controller 106 and the data storage device 102. For example, firmware is loaded in a ROM of the memory 124 as computer executable instructions. Those computer executable instructions are capable of being retrieved from the memory 124 and executed by the processor 122 to control the operation of the controller 106 and perform the processes described herein. In some implementations, one or more modules of the controller 106 correspond to separate hardware components within the controller 106. In other implementations, one or more modules of the controller 106 correspond to software stored within the memory 124 and executed by the processor 122. The memory 124 is configured to store data used by the controller 106 during operation.

Figure 2:
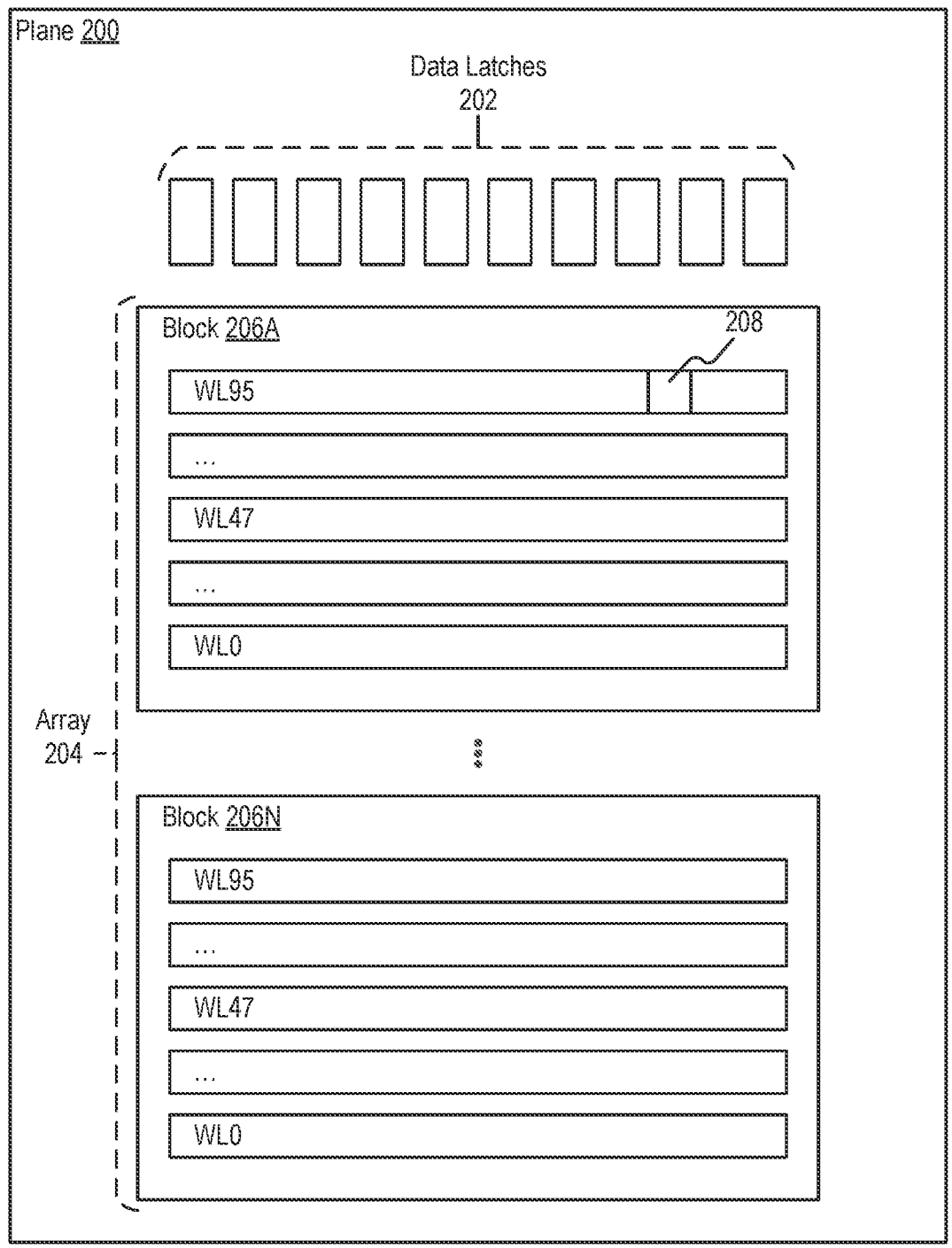
FIG. 2 is a block diagram of one example of a plane included in a die of a NAND memory, in accordance with some implementations of the present disclosure.

Each of the plurality of dies 112A-112N of the NAND memory 104 includes a plurality of planes. For example, die 112A may include two planes. FIG. 2 is a block diagram of one example of a plane 200. The plane 200 illustrated in FIG. 2 includes a plurality of data latches 202 and an array 204. The data latches 202 are configured to hold one full page of data. Thus, data stored in the plane 200 can be read or written one page at a time. The array 204 includes a plurality of blocks 206A-206N. Each of the blocks 206A-206N includes a plurality of word lines. For example, block 206A includes word lines 95 to 0. Each of the word lines includes a plurality of storage elements. For example, in FIG. 2, word line 95 in block 206A includes a representative storage element 208. In some implementations, the storage element 208 is a multi-level cell ("MLC") flash memory cell, such as a four bits per cell ("4BPC") flash memory cell. In other implementations, the storage element 208 is a single level cell ("SLC") flash memory cell, a two bits per cell ("2BPC") flash memory cell, a three bits per cell ("3BPC") flash memory cell, or a flash memory cell having a larger number of bits per cell (for example, between five and ten bits per cell).

Figure 3:
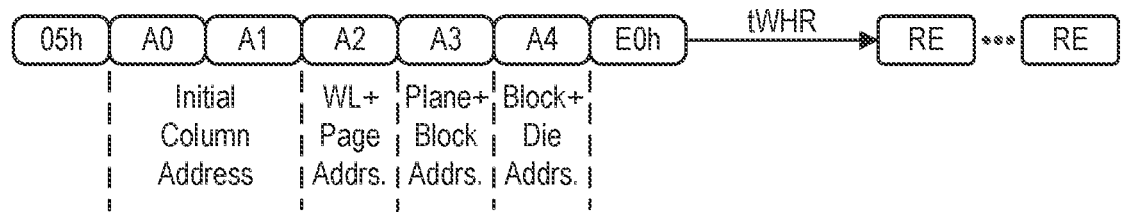
FIG. 3 is a block diagram of one example of a legacy data-out protocol sequence.

FIG. 3 is a block diagram of one example of a legacy data-out protocol sequence. The legacy data-out protocol sequence illustrated in FIG. 3 includes a series of commands and addresses sent from the controller 106 to the NAND memory 104 for a data-out operation. The 05h command indicates that a five-byte address will follow. The five-byte address includes a two-byte initial column address, a word line address, a page address, a plane address, a block address, and a die address. The E0h command indicates that the five-byte address has ended, and that the controller 106 is waiting to stream out data. After sending the E0h command, the controller 106 wait a predetermined amount of time for the read/write circuit 114 of the NAND memory 104 to fetch data. To fetch data, the read/write circuit 114 of the NAND memory 104 translates the two-byte initial column address (which is a logical value) to an initial physical column address, sets a column pointer to the initial physical column address, and fetches the data using the data latches 202. After the data is stored in the data latches 202, the controller 106 sends a read enable ("RE") command. Responsive to receiving the RE command, the read/write circuit 114 of the NAND memory 104 sends the data in the data latches 202 to the controller 106 via the I/O bus 116, increments the column pointer by one, and fetches new data, again, using the data latches 202. The controller 106 sends additional RE commands to receive additional data until the data-out operation is complete. Assuming a cycle time of 10 nanoseconds, the total time required to send the 05H command, the five-byte address, and the E0h command is 70 nanoseconds. Further, the wait time between the controller 106 sending the E0h command and receiving data (i.e., tWHR) is approximately 300 nanoseconds. Thus, the total execution time is 370 nanoseconds.

A significant portion of the tWHR time is caused by the read/write circuit 114 of the NAND memory 104 translating the received initial logical column address to an initial physical column address. When executing sequential read operations, the initial column address is always logical column 0. Thus, in some implementations, for each plane in each of the plurality of dies 112A-112N of the NAND memory 104, the read/write circuit 114 of the NAND memory 104 is configured to pre-calculate a physical column address corresponding to logical column 0 and store the determined physical column address as an initial physical column address. During a data-out operation, responsive to receiving a die address and a plane address from the controller 106, the read/write circuit 114 of the NAND memory 104 retrieves the pre-calculated initial physical column address associated with the received die address and plane address. It takes less time to retrieve a pre-calculated initial physical column address than to translate a received initial logical column address to an initial physical column address. Thus, pre-calculating initial physical column addresses reduces the tWHR time.

Figure 4:
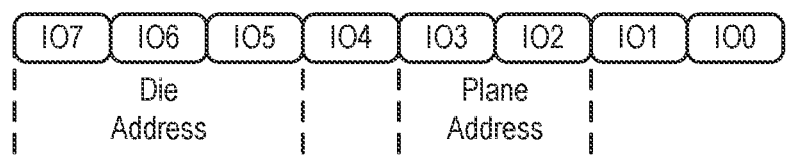
FIG. 4 is a block diagram of one example of a one-byte address cycle for a data-out protocol sequence, in accordance with some implementations of the present disclosure.

To further reduce the overall execution time, the above-described five-byte address sent from the controller 106 to the NAND memory 104 is replaced a one-byte address. For example, during a data-out operation (i.e., a read operation), the NAND memory 104 does need to receive a word line address, a page address, and a block address because the controller 106 exchanges data with the NAND memory 104 through the data latches 202, not the array 204. Furthermore, the NAND memory 104 does not to receive an initial column address because, as described above, an initial physical column address is pre-calculated for each plane. Thus, the NAND memory 104 only needs to receive a die address and a plane address. FIG. 4 is a block diagram of one example of a one-byte address cycle for a data-out protocol sequence. The one-byte address cycle illustrated in FIG. 4 includes a die address and a plane address. The unused bits in the one-byte address cycle may be used, for example, for next generation expansion.

Figure 5:
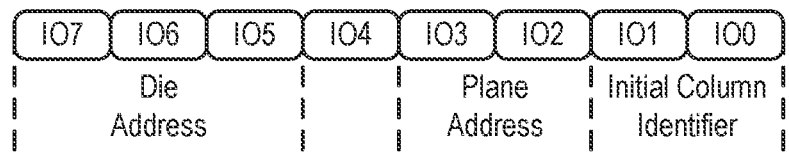
FIG. 5 is a block diagram of one example of a one-byte address cycle for a data-out protocol sequence that includes a two-bit initial column identifier, in accordance with some implementations of the present disclosure.

When data is stored in the NAND memory 104 as fixed-length codewords, not every column address can be an initial column address. For example, a 16K page storing 4K codewords can only have four initial column addresses. Thus, in some implementations, for each plane in each of the plurality of dies 112A-112N of the NAND memory 104, the read/write circuit 114 of the NAND memory 104 is configured to pre-calculate physical column addresses for each potential initial column address and store the determined physical column addresses as initial physical column addresses. For example, for a 16K page storing 4K codewords, the read/write circuit 114 on the NAND memory 104 determines and stores the four potential initial column addresses. Each pre-calculated potential initial column address is associated with an initial column identifier. For example, for a 16K page storing 4K codewords, '00' may be the initial column identifier associated with the first codeword, '01' may be the initial column identifier associated with the second codeword, '10' may be an initial column identifier associated with the third codeword, and '11' may be the initial column identifier associated with the fourth codeword. During a data-out operation, responsive to receiving a die address, a plane address, and an initial column identifier from the controller 106, the read/write circuit 114 of the NAND memory 104 retrieves the pre-calculated initial physical column address associated with the received die address, plane address, and initial column identifier. FIG. 5 is a block diagram of one example of a one-byte address cycle for a data-out protocol sequence. The one-byte address cycle illustrated in FIG. 5 includes a die address, a plane address, and a two-bit initial column identifier.

Figure 6:
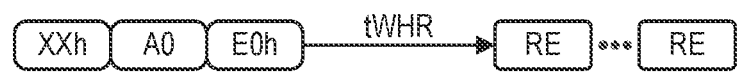
FIG. 6 is a block diagram of one example of a data-out protocol sequence including two command cycles and one address cycle, in accordance with some implementations of the present disclosure.
Figure 7:
FIG. 7 is a block diagram of one example of a data-out protocol sequence including one command cycle and one address cycle, in accordance with some implementations of the present disclosure.

Replacing the above-described five-byte address with one of the above-described one-byte addresses reduces the number of address cycles in a data-out protocol sequence from five to one. For example, FIG. 6 is a block diagram of a data-out protocol sequence including two command cycles and one address cycle. Assuming a cycle time of 10 nanoseconds, the total time required to send the two commands and the one-byte address illustrated in FIG. 6 is 30 nanoseconds. In some implementations, the NAND memory 104 is configured to retrieve data in direct response to the NAND memory 104 receiving the one-byte address from the controller 106. For example, the controller 106 does not need to send the E0h command after sending the one-byte address as illustrated in FIG. 7. Assuming a cycle time of 10 nanoseconds, the total time required to send the one command and the one-byte address illustrated in FIG. 7 is 20 nanoseconds. The 30 nanosecond and 20 nanosecond total command/address cycle times of the data-out protocol sequences illustrated in FIGS. 6 and 7, respectively, are significantly less than the 70 nanosecond total command/address cycle time of the legacy data-out protocol sequence illustrated in FIG. 3.

Figure 8:
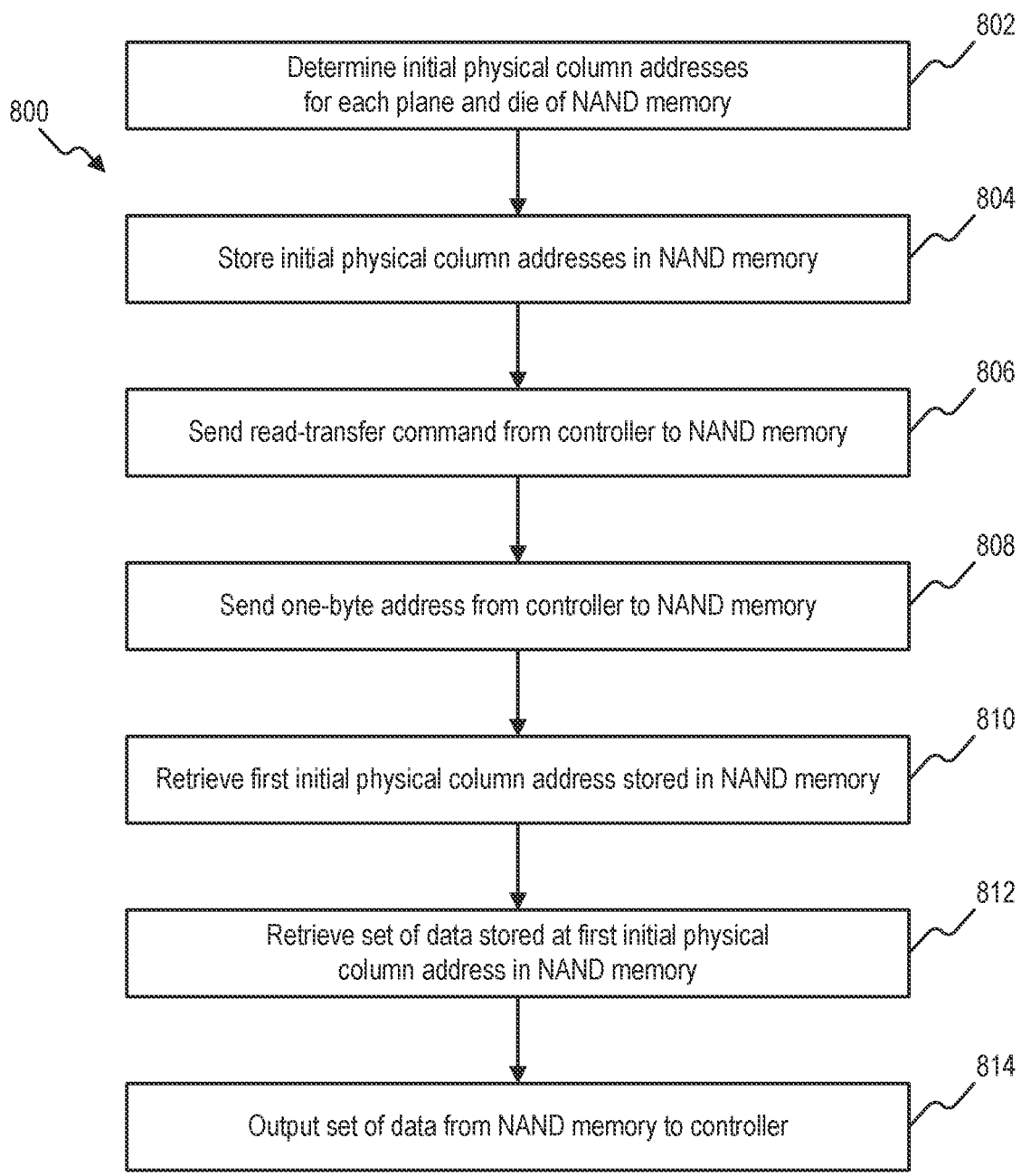
FIG. 8 is a flow diagram of an example of a method for performing a data-out operation, in accordance with some implementations of the present disclosure.

FIG. 8 is a flow diagram of one example of a method 800 for performing a data-out operation, in accordance with some implementations of the present disclosure. At block 802, the NAND memory 104 determines initial physical column addresses for each of the planes in each of the dies 112A-112N of the NAND memory 104. In some implementations, the NAND memory 104 determines one initial physical column address for each plane. For example, the NAND memory 104 may determine the initial physical column addresses assuming that the initial column address is always logical column 0. In other implementations, the NAND memory 104 determines multiple initial physical column addresses for each plane. For example, assuming data is stored as 4K codewords in 16K pages, the NAND memory 104 determines four initial physical column addresses for each plane. In some implementations, the NAND memory 104 determines the initial physical column addresses based on each die's bad column information. For example, the NAND memory 104 may determine one or more bad column addresses for each of the dies 112A-112N of the NAND memory 104, and then determine initial physical column addresses based on the one or more bad column addresses. At block 804, the initial physical column addresses are stored in the NAND memory 104. In some implementations, blocks 802 and 804 are executed during power-on resets of the NAND memory 104. For example, the initial physical column address may be stored in a memory included in the read/write circuit 114.

After the initial physical column addresses are stored in the NAND memory 104, at block 806, a read-transfer command is sent from the controller 106 to the NAND memory 104. As used herein, the term "read-transfer command" refers to one or more commands for the read protocol and the transfer protocol. The read-transfer command indicates that a one-byte address will follow. At block 808, a one-byte address is sent from the controller 106 to the NAND memory 104. The one-byte address includes a die address and a plane address. In some implementations, the one-byte address also includes an initial column identifier. After receiving the one-byte address, at block 810, the NAND memory 104 retrieves a first initial physical column address from the initial physical column addresses stored in the NAND memory 104. The first initial column address is associated with the die address and the plane address included in the one-byte address. When the one-byte address also includes an initial column identifier, the retrieved initial column address is further associated with the initial column identifier. At block 812, the NAND memory 104 retrieves a set of data stored at the first initial physical column address in the NAND memory 104. For example, the read/write circuit 114 may set a column pointer to the first initial physical column address, retrieve a page of data, and hold the page of data in the data latches 202. At block 814, the NAND memory 104 outputs the set of data to the controller 106. For example, the read/write circuit 114 may put the set of data on the I/O bus 116.

Figure 9:
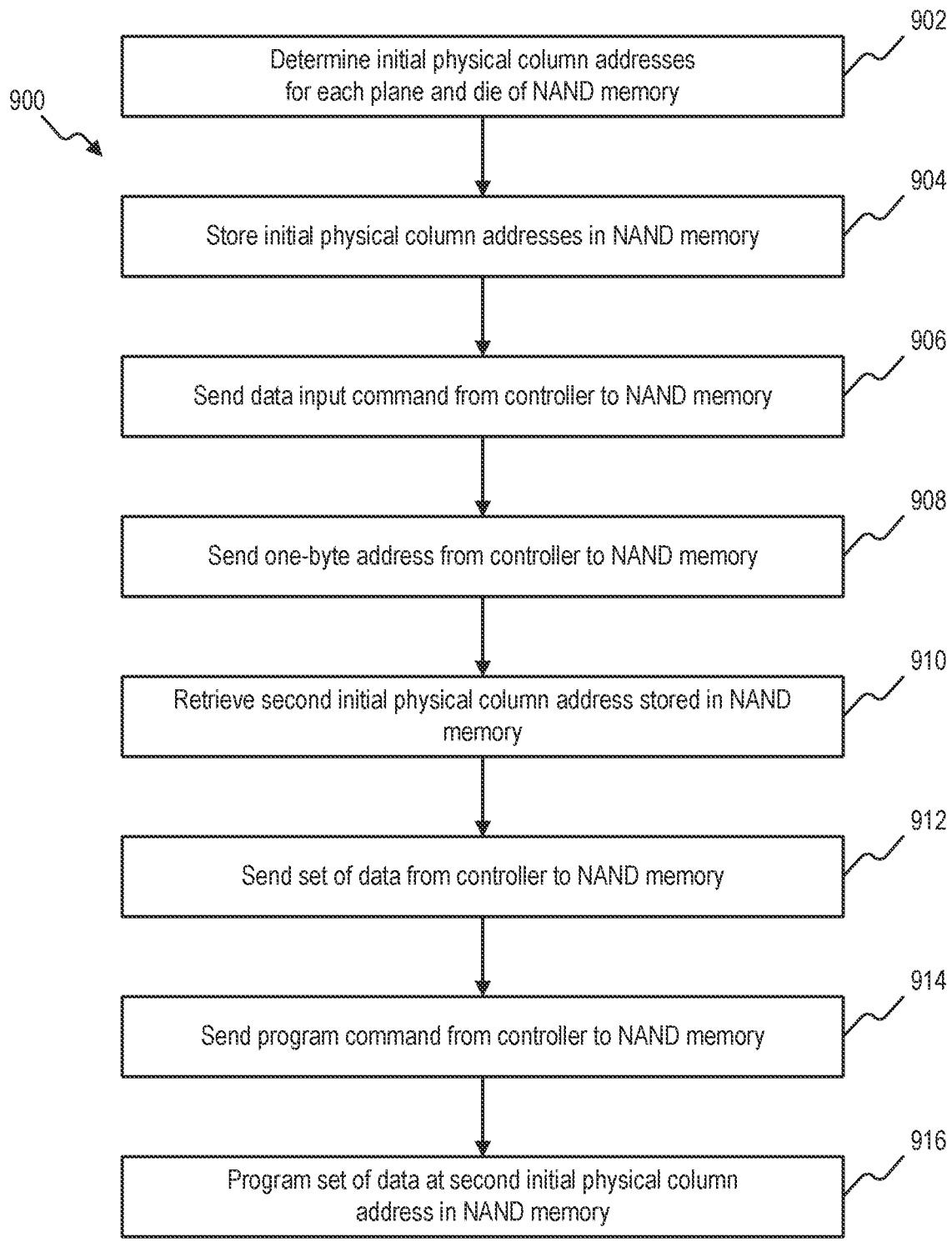
FIG. 9 is a flow diagram of an example of a method for performing a data-in and program operation, in accordance with some implementations of the present disclosure.

In addition to reducing the execution time of data-out operations, the above-described processes can also reduce the execution time of data-in operations (for example, data-in and program operations). FIG. 9 is a flow diagram of one example of a method 900 for performing a data-in operation, in accordance with some implementations of the present disclosure. At block 902, the NAND memory 104 determines initial physical column addresses for each of the planes in each of the dies 112A-112N of the NAND memory 104. At block 904, the initial physical column addresses are stored in the NAND memory 104. After the initial physical column addresses are stored in the NAND memory 104, at block 906, a data input command is sent from the controller 106 to the NAND memory 104. The data input command indicates that a one-byte address will follow. At block 908, the one-byte address is sent from the controller 106 to the NAND memory 104. The one-byte address (an example of a "second one-byte address") includes a die address, a plane address, and a page address. After receiving the one-byte address, at block 910, the NAND memory 104 retrieves a second initial physical column address from the initial physical column addresses stored in the NAND memory 104. The second initial column address is associated with the die address and the plane address included in the one-byte address. At block 912, the controller 106 sends a set of data to the NAND memory 104. At block 914, the controller 106 sends a program command to the NAND memory 104. For example, the controller 106 sends may send a 10h command or a 15h command to the NAND memory 104 via the I/O bus 116. At block 916, the NAND memory 104 programs the set of data at the second initial physical column address.

Figure 10:
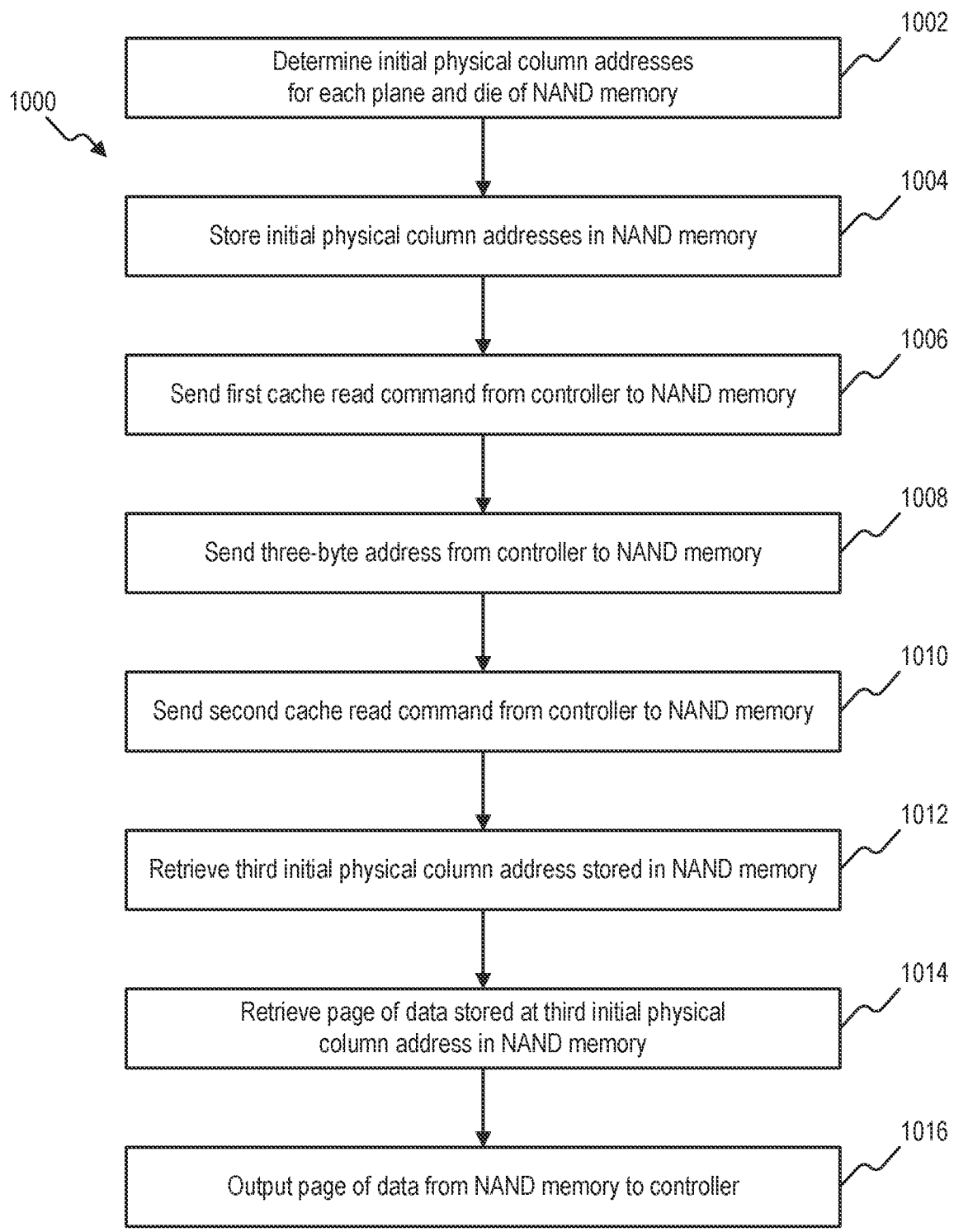
FIG. 10 is a flow diagram of an example of a method for performing a cache read operation, in accordance with some implementations of the present disclosure.

The above-described processes can also reduce the execution time of cache read operations. FIG. 10 is a flow diagram of one example of a method 1000 for performing a cache read operation in accordance with some implementations of the invention. At block 1002, the NAND memory 104 determines initial physical column addresses for each of the planes in each of the dies 112A-112N of the NAND memory 104. At block 1004, the initial physical column addresses are stored in the NAND memory 104. After the initial physical column addresses are stored in the NAND memory 104, at block 1006, a first cache read command is sent from the controller 106 to the NAND memory 104. The first cache read command indicates that a three-byte address will follow. At block 1008, a three-byte address is sent from the controller 106 to the NAND memory 104. The three-byte address includes, among other things, a die address, a plane address, and a page address. At block 1010, the controller 106 sends a second cache read command to the NAND memory 104. For example, the controller 106 sends may send a 30h command to the NAND memory 104 via the I/O bus 116. After receiving the second cache read command, at block 1012, the NAND memory 104 retrieves a third initial physical column address from the initial physical column addresses stored in the NAND memory 104. The third initial physical column address is associated with the die address and the plane address included in the three-byte address. At block 1014, the NAND memory 104 retrieves a page of data stored at the third initial physical column address in the NAND memory 104. For example, the read/write circuit 114 may set a column pointer to the third initial physical column address, retrieve a page of data, and hold the page of data in the data latches 202. At block 1016, the NAND memory 104 outputs the page of data to the controller 106. For example, the read/write circuit 114 may put the page of data on the I/O bus 116.

In some implementations, after the NAND memory 104 retrieves the page of data at block 1014, the controller 106 sends a third cache read command. The third cache read command increments the page address while keeping the block address and the plane address the same. After receiving the third cache read command, the NAND memory 104 increments the page address by one to determine a new page address, retrieves a new page of data, and outputs the new page of data to the controller 106.

In connection with the disclosed implementations, an apparatus includes means for determining initial physical column addresses for each of a plurality of planes in each of a plurality of dies in a NAND memory. The means for determining the initial physical column addresses may correspond, for example, to one or more of the dies 112A-112N, the read/write circuit 114, or a combination thereof. The apparatus also includes means for storing the initial physical column addresses in the NAND memory. The means for storing the initial physical column addresses in the NAND memory may correspond, for example, to one or more of the dies 112A-112N, the read/write circuit 114, or a combination thereof. The apparatus also includes means for sending a read-transfer command to the NAND memory after the NAND memory stores the initial physical column addresses. The means for sending the read-transfer command to the NAND memory may correspond, for example, to the I/O bus 116, the memory interface 120, the processor 122, or a combination thereof. The read-transfer command indicates that a one-byte address will follow. The apparatus also includes means for sending the one-byte address to the NAND memory. The means for sending the one-byte address to the NAND memory may correspond, for example, to the I/O bus 116, the memory interface 120, the processor 122, or a combination thereof. The one-byte address includes a die address and a plane address. The apparatus also includes means for retrieving a first initial physical column address from the initial physical column addresses stored in the NAND memory after the NAND memory receives the one-byte address. The means for retrieving the first initial physical column address may correspond, for example, to one or more of the dies 112A-112N, the read/write circuit 114, or a combination thereof. The first initial physical column address is associated with the die address and the plane address. The apparatus also includes means for retrieving a first set of data stored at the first initial physical column address in the NAND memory. The means for retrieving the first set of data may correspond, for example, to one or more of the dies 112A-112N, the read/write circuit 114, or a combination thereof. The apparatus also includes means for outputting the first set of data from the NAND memory. The means for outputting the first of data from the NAND memory may correspond, for example, to one or more of the dies 112A-112N, the read/write circuit 114, the I/O bus 116, or a combination thereof.

In some implementations, the means for determining the initial physical column addresses is further configured to determine each of the initial physical column addresses based on a logical column 0.

In some implementations, the apparatus further includes means for retrieving the first initial physical column address in direct response to the NAND memory receiving the one-byte address.

In some implementations, the means for determining the initial physical column addresses is further configured to determine a plurality of the initial physical column addresses for each of the plurality of planes in each of the plurality of dies. In some implementations, the one-byte address further includes an initial column identifier. In some implementations, the first initial physical column address is further associated with the initial column identifier.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain implementations and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A data storage device, comprising:
a NAND memory including:
a plurality of dies that each include a plurality of planes, and
a read/write circuit configured to:
determine initial physical column addresses for each of the plurality of planes in each of the plurality of dies, and
store the initial physical column addresses in the NAND memory; and
a controller coupled to the NAND memory and configured to:
send a first cache read command to the NAND memory, wherein the first cache read command indicating that a three-byte address will follow,
send the three-byte address to the NAND memory, wherein the three-byte address including at least a first die address, a first plane address, and a first page address, and
send a second cache read command to the NAND memory,
wherein the read/write circuit is further configured to:
retrieve a first initial physical column address from the initial physical column addresses stored in the NAND memory after the NAND memory receives the second cache read command from the controller, wherein the first initial physical column address is associated with the first die address and the first plane address,
retrieve a first page of data stored at the first initial physical column address, wherein the first page of data is associated with the first page address, and
output the first page of data to the controller.

2. The data storage device of claim 1, wherein the read/write circuit is further configured to determine each of the initial physical column addresses based on a logical column 0.

3. The data storage device of claim 1, wherein the controller is further configured to send a third cache read command to the NAND memory, wherein the read/write circuit is further configured to:
increment the first page address by one to determine a second page address,
retrieve a second page of data associated with the second page address, and
output the second page of data to the controller.

4. The data storage device of claim 1, wherein the controller is further configured to:
send a read-transfer command to the NAND memory after the NAND memory stores the initial physical column addresses, wherein the read-transfer command indicating that a one-byte address will follow, and
send the one-byte address to the NAND memory, wherein the one-byte address including a second die address and a second plane address,
wherein the read/write circuit is further configured to:
retrieve a second initial physical column address from the initial physical column addresses stored in the NAND memory after the NAND memory receives the one-byte address from the controller, wherein the second initial physical column address is associated with the second die address and the second plane address,
retrieve a first set of data stored at the second initial physical column address,
output the first set of data to the controller, send a data input command to the NAND memory after the NAND memory stores the initial physical column addresses, wherein the data input command indicating that a second one-byte address will follow,
send the second one-byte address to the NAND memory, wherein the second one-byte address including at least a third die address and a third plane address,
send a second set of data to the NAND memory, and
send a program command to the NAND memory,
wherein the read/write circuit is further configured to:
retrieve a third initial physical column address from the initial physical column addresses stored in the NAND memory after the NAND memory receives the second one-byte address from the controller, wherein the third initial physical column address is associated with the third die address and the third plane address, and
program the second set of data at the third initial physical column address after the NAND memory receives the program command from the controller.

5. The data storage device of claim 1, wherein the controller is further configured to:
send a read-transfer command to the NAND memory after the NAND memory stores the initial physical column addresses, wherein the read-transfer command indicating that a one-byte address will follow, and
send the one-byte address to the NAND memory, wherein the one-byte address including a second die address and a second plane address,
wherein the read/write circuit is further configured to:
retrieve a second initial physical column address from the initial physical column addresses stored in the NAND memory after the NAND memory receives the one-byte address from the controller, wherein the second initial physical column address is associated with the second die address and the second plane address,
retrieve a first set of data stored at the second initial physical column address, and
output the first set of data to the controller,
wherein the read/write circuit is further configured to retrieve the second initial physical column address in direct response to the NAND memory receiving the one-byte address from the controller.

6. The data storage device of claim 1, wherein the controller is further configured to:
send a read-transfer command to the NAND memory after the NAND memory stores the initial physical column addresses, wherein the read-transfer command indicating that a one-byte address will follow, and
send the one-byte address to the NAND memory, wherein the one-byte address including a second die address and a second plane address,
wherein the read/write circuit is further configured to:
retrieve a second initial physical column address from the initial physical column addresses stored in the NAND memory after the NAND memory receives the one-byte address from the controller, wherein the second initial physical column address is associated with the second die address and the second plane address,
retrieve a first set of data stored at the second initial physical column address, and
output the first set of data to the controller,
wherein the read/write circuit is further configured to determine a plurality of the initial physical column addresses for each of the plurality of planes in each of the plurality of dies, and wherein the one-byte address further including an initial column identifier, and wherein the second initial physical column address is further associated with the initial column identifier.

7. The data storage device of claim 1, wherein the controller is further configured to:
send a read-transfer command to the NAND memory after the NAND memory stores the initial physical column addresses, wherein the read-transfer command indicating that a one-byte address will follow, and
send the one-byte address to the NAND memory, wherein the one-byte address including a second die address and a second plane address,
wherein the read/write circuit is further configured to:
retrieve a second initial physical column address from the initial physical column addresses stored in the NAND memory after the NAND memory receives the one-byte address from the controller, wherein the second initial physical column address is associated with the second die address and the second plane address,
retrieve a first set of data stored at the second initial physical column address, and output the first set of data to the controller,
wherein the read/write circuit is further configured to:
determine one or more bad column addresses for each of the plurality of dies, and
determine the initial physical column addresses based on the one or more bad column addresses.

8. A method, comprising:
sending a first cache read command from a controller to a NAND memory, wherein the first cache read command indicating that a three-byte address will follow;
sending the three-byte address from the controller to the NAND memory, wherein the three-byte address including at least a first die address, a first plane address, and a first page address;
sending a second cache read command from the controller to the NAND memory;
retrieving a first initial physical column address from initial physical column addresses stored in the NAND memory after the NAND memory receives the second cache read command from the controller, wherein the first initial physical column address is associated with the first die address and the first plane address;
retrieving a first page of data stored at the first initial physical column address, wherein the first page of data is associated with the first page address; and
outputting the first page of data from the NAND memory to the controller.

9. The method of claim 8, further comprising:
determining, with the NAND memory, the initial physical column addresses for each of a plurality of planes in each of a plurality of dies in the NAND memory by determining each of the initial physical column addresses based on a logical column 0;
storing the initial physical column addresses in the NAND memory;
sending a read-transfer command from the controller to the NAND memory after the NAND memory stores the initial physical column addresses, wherein the read-transfer command indicating that a one-byte address will follow;
sending the one-byte address from the controller to the NAND memory, wherein the one-byte address including a second die address and a second plane address;
retrieving a second initial physical column address from the initial physical column addresses stored in the NAND memory after the NAND memory receives the one-byte address from the controller, wherein the second initial physical column address is associated with the second die address and the second plane address;
retrieving a first set of data stored at the second initial physical column address in the NAND memory; and
outputting the first set of data from the NAND memory to the controller.

10. The method of claim 8, further comprising:
determining, with the NAND memory, the initial physical column addresses for each of a plurality of planes in each of a plurality of dies in the NAND memory;
storing the initial physical column addresses in the NAND memory;
sending a read-transfer command from the controller to the NAND memory after the NAND memory stores the initial physical column addresses, wherein the read-transfer command indicating that a one-byte address will follow;
sending the one-byte address from the controller to the NAND memory, wherein the one-byte address including a second die address and a second plane address;
retrieving a second initial physical column address from the initial physical column addresses stored in the NAND memory after the NAND memory receives the one-byte address from the controller, wherein the second initial physical column address is associated with the second die address and the second plane address;
retrieving a first set of data stored at the second initial physical column address in the NAND memory;
outputting the first set of data from the NAND memory to the controller;
sending a data input command from the controller to the NAND memory after the NAND memory stores the initial physical column addresses, wherein the data input command indicating that a second one-byte address will follow;
sending the second one-byte address from the controller to the NAND memory, wherein the second one-byte address including at least a third die address and a third plane address;
retrieving a third initial physical column address from the initial physical column addresses stored in the NAND memory after the NAND memory receives the second one-byte address from the controller, wherein the third initial physical column address is associated with the third die address and the third plane address;
sending a second set of data from the controller to the NAND memory;
sending a program command from the controller to the NAND memory; and
programming the second set of data at the third initial physical column address in the NAND memory after the NAND memory receives the program command from the controller.

11. The method of claim 8, further comprising:
sending a third cache read command from the controller to the NAND memory;
incrementing the first page address by one to determine a second page address;
retrieving a second page of data associated with the second page address; and
outputting the second page of data from the NAND memory to the controller.

12. The method of claim 8, further comprising
determining, with the NAND memory, the initial physical column addresses for each of a plurality of planes in each of a plurality of dies in the NAND memory;
storing the initial physical column addresses in the NAND memory;
sending a read-transfer command from the controller to the NAND memory after the NAND memory stores the initial physical column addresses, wherein the read-transfer command indicating that a one-byte address will follow;
sending the one-byte address from the controller to the NAND memory, wherein the one-byte address including a second die address and a second plane address;
retrieving a second initial physical column address from the initial physical column addresses stored in the NAND memory after the NAND memory receives the one-byte address from the controller, wherein the second initial physical column address is associated with the second die address and the second plane address, and wherein retrieving the second initial physical column address is in direct response to the NAND memory receiving the one-byte address from the controller;
retrieving a first set of data stored at the second initial physical column address in the NAND memory; and
outputting the first set of data from the NAND memory to the controller.

13. The method of claim 8, further comprising:
determining, with the NAND memory, a plurality of the initial physical column addresses for each of a plurality of planes in each of a plurality of dies;
storing the initial physical column addresses in the NAND memory;
sending a read-transfer command from the controller to the NAND memory after the NAND memory stores the initial physical column addresses, wherein the read-transfer command indicating that a one-byte address will follow, wherein the one-byte address further includes an initial column identifier;
sending the one-byte address from the controller to the NAND memory, wherein the one-byte address including a second die address and a second plane address;
retrieving a second initial physical column address from the initial physical column addresses stored in the NAND memory after the NAND memory receives the one-byte address from the controller, wherein the second initial physical column address is associated with the second die address and the second plane address, and wherein the second initial physical column address is further associated with the initial column identifier;
retrieving a first set of data stored at the second initial physical column address in the NAND memory; and
outputting the first set of data from the NAND memory to the controller.

14. The method of claim 8, further comprising:
determining, with the NAND memory, one or more bad column addresses for each of a plurality of dies;
determining, with the NAND memory, the initial physical column addresses for each of a plurality of planes in each of the plurality of dies in the NAND memory based on the one or more bad column addresses;
storing the initial physical column addresses in the NAND memory;
sending a read-transfer command from the controller to the NAND memory after the NAND memory stores the initial physical column addresses, wherein the read-transfer command indicating that a one-byte address will follow;
sending the one-byte address from the controller to the NAND memory, wherein the one-byte address including a second die address and a second plane address;
retrieving a second initial physical column address from the initial physical column addresses stored in the NAND memory after the NAND memory receives the one-byte address from the controller, wherein the second initial physical column address is associated with the second die address and the second plane address;
retrieving a first set of data stored at the second initial physical column address in the NAND memory; and
outputting the first set of data from the NAND memory to the controller.

15. An apparatus, comprising:
means for sending a first cache read command from a controller to a NAND memory, wherein the first cache read command indicating that a three-byte address will follow;
means for sending the three-byte address from the controller to the NAND memory, wherein the three-byte address including at least a first die address, a first plane address, and a first page address;
means for sending a second cache read command from the controller to the NAND memory;
means for retrieving a first initial physical column address from initial physical column addresses stored in the NAND memory after the NAND memory receives the second cache read command from the controller, wherein the first initial physical column address is associated with the first die address and the first plane address;
means for retrieving a first page of data stored at the first initial physical column address, wherein the first page of data is associated with the first page address; and
means for outputting the first page of data from the NAND memory to the controller.

16. The apparatus of claim 15, further comprising:
means for determining, with the NAND memory, the initial physical column addresses for each of a plurality of planes in each of a plurality of dies in the NAND memory by determining each of the initial physical column addresses based on a logical column 0;
means for storing the initial physical column addresses in the NAND memory;
means for sending a read-transfer command from the controller to the NAND memory after the NAND memory stores the initial physical column addresses, wherein the read-transfer command indicating that a one-byte address will follow;
means for sending the one-byte address from the controller to the NAND memory, wherein the one-byte address including a second die address and a second plane address;
means for retrieving a second initial physical column address from the initial physical column addresses stored in the NAND memory after the NAND memory receives the one-byte address from the controller, wherein the second initial physical column address is associated with the second die address and the second plane address;
means for retrieving a first set of data stored at the second initial physical column address in the NAND memory; and means for outputting the first set of data from the NAND memory to the controller.

17. The apparatus of claim 15, further comprising:
means for determining, with the NAND memory, the initial physical column addresses for each of a plurality of planes in each of a plurality of dies in the NAND memory;
means for storing the initial physical column addresses in the NAND memory;
means for sending a read-transfer command from the controller to the NAND memory after the NAND memory stores the initial physical column addresses, wherein the read-transfer command indicating that a one-byte address will follow;
means for sending the one-byte address from the controller to the NAND memory, wherein the one-byte address including a second die address and a second plane address;
means for retrieving a second initial physical column address from the initial physical column addresses stored in the NAND memory after the NAND memory receives the one-byte address from the controller, wherein the second initial physical column address is associated with the second die address and the second plane address;
means for retrieving a first set of data stored at the second initial physical column address in the NAND memory;
means for outputting the first set of data from the NAND memory to the controller;
means for sending a data input command from the controller to the NAND memory after the NAND memory stores the initial physical column addresses, wherein the data input command indicating that a second one-byte address will follow;
means for sending the second one-byte address from the controller to the NAND memory, wherein the second one-byte address including at least a third die address and a third plane address;
means for retrieving a third initial physical column address from the initial physical column addresses stored in the NAND memory after the NAND memory receives the second one-byte address from the controller, wherein the third initial physical column address is associated with the third die address and the third plane address;
means for sending a second set of data from the controller to the NAND memory;
means for sending a program command from the controller to the NAND memory; and
means for programming the second set of data at the third initial physical column address in the NAND memory after the NAND memory receives the program command from the controller.

18. The apparatus of claim 15, further comprising:
means for sending a third cache read command from the controller to the NAND memory;
means for incrementing the first page address by one to determine a second page address;
means for retrieving a second page of data associated with the second page address; and
means for outputting the second page of data from the NAND memory to the controller.

19. The apparatus of claim 15, further comprising
means for determining, with the NAND memory, the initial physical column addresses for each of a plurality of planes in each of a plurality of dies in the NAND memory;
means for storing the initial physical column addresses in the NAND memory;
means for sending a read-transfer command from the controller to the NAND memory after the NAND memory stores the initial physical column addresses, wherein the read-transfer command indicating that a one-byte address will follow;
means for sending the one-byte address from the controller to the NAND memory, wherein the one-byte address including a second die address and a second plane address;
means for retrieving a second initial physical column address from the initial physical column addresses stored in the NAND memory after the NAND memory receives the one-byte address from the controller, wherein the second initial physical column address is associated with the second die address and the second plane address, and wherein retrieving the second initial physical column address is in direct response to the NAND memory receiving the one-byte address from the controller;
means for retrieving a first set of data stored at the second initial physical column address in the NAND memory; and
means for outputting the first set of data from the NAND memory to the controller.

20. The apparatus of claim 15, further comprising:
means for determining, with the NAND memory, a plurality of the initial physical column addresses for each of a plurality of planes in each of a plurality of dies;
means for storing the initial physical column addresses in the NAND memory;
means for sending a read-transfer command from the controller to the NAND memory after the NAND memory stores the initial physical column addresses, wherein the read-transfer command indicating that a one-byte address will follow, wherein the one-byte address further includes an initial column identifier;
means for sending the one-byte address from the controller to the NAND memory, wherein the one-byte address including a second die address and a second plane address;
means for retrieving a second initial physical column address from the initial physical column addresses stored in the NAND memory after the NAND memory receives the one-byte address from the controller, wherein the second initial physical column address is associated with the second die address and the second plane address, and wherein the second initial physical column address is further associated with the initial column identifier;
means for retrieving a first set of data stored at the second initial physical column address in the NAND memory; and
means for outputting the first set of data from the NAND memory to the controller.

* * * * *